US010256856B2

United States Patent
Das et al.

(10) Patent No.: US 10,256,856 B2
(45) Date of Patent: Apr. 9, 2019

(54) RADIO RECEIVER, METHOD OF DETECTING AN OBTRUDING SIGNAL IN THE RADIO RECEIVER, AND COMPUTER PROGRAM

(71) Applicant: Telefonaktiebolaget LM Ericsson (publ), Stockholm (SE)

(72) Inventors: Sajal Kumar Das, Bangalore (IN); Vijaykumar Kuppusamy, Bangalore (IN)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 15/523,361

(22) PCT Filed: Oct. 31, 2014

(86) PCT No.: PCT/EP2014/073459
§ 371 (c)(1),
(2) Date: Apr. 28, 2017

(87) PCT Pub. No.: WO2016/066217
PCT Pub. Date: May 6, 2016

(65) Prior Publication Data
US 2017/0257125 A1    Sep. 7, 2017

(51) Int. Cl.
*H03M 1/06* (2006.01)
*H04B 1/10* (2006.01)
*H04L 27/38* (2006.01)

(52) U.S. Cl.
CPC ........ *H04B 1/1027* (2013.01); *H03M 1/0629* (2013.01); *H04L 27/38* (2013.01)

(58) Field of Classification Search
USPC ................ 375/219, 220, 222, 229–236, 240, 375/240.26–240.27, 240.29, 259, 285,
(Continued)

(56) References Cited

U.S. PATENT DOCUMENTS 5,448,602 A * 9/1995 Ohmori ............... H04B 7/084
375/330
6,307,897 B1 * 10/2001 Ohta ..................... H03D 3/009
375/316

(Continued)

FOREIGN PATENT DOCUMENTS

CA    1267960 A    9/2000
CN    1267960 A    9/2000
(Continued)

OTHER PUBLICATIONS

PCT International Search Report, dated Feb. 27, 2015, in connection with International Application No. PCT/EP2014/073459, all pages.
(Continued)

*Primary Examiner* — Linda Wong
(74) *Attorney, Agent, or Firm* — Laffler Intellectual Property Law, PLLC

(57) ABSTRACT

A method of detecting an obtruding signal in a radio receiver, a receiver and a computer program are disclosed. The receiver has a mixer arranged to mix a received signal to an analog baseband signal at or close to zero-frequency, a filter arranged to low-pass filter said analog baseband signal, and an analog-to-digital converter arranged to sample said filtered analog baseband signal at a sample frequency such that a digital baseband signal is formed. The method comprised receiving a radio frequency signal, mixing the radio frequency signal to the analog baseband signal at or close to zero-frequency, low-pass filtering said analog baseband signal, and analog-to-digital converting said filtered analog baseband signal at an over sample frequency such that a digital baseband signal is formed. The method further comprises frequency translating the digital baseband signal around a Nyquist frequency being based on a nominal sample frequency, the nominal sample frequency being a fraction of the oversampling frequency according to the
(Continued)

oversampling rate, to form a translated digital baseband signal such that signal content of the digital baseband signal around zero frequency will be translated to around the nominal sample frequency and vice versa in the translated digital baseband signal, determining a first signal level at zero frequency of the digital baseband signal and a second signal level at zero frequency of the translated digital baseband signal, detecting an obtruding signal based on a relation between the first and second signal levels, and outputting an obtruding signal state signal.

24 Claims, 6 Drawing Sheets

(58) Field of Classification Search
USPC ....... 375/284, 286, 316, 340, 346, 347, 350, 375/354, 355, 3
See application file for complete search history.

(56) References Cited

U.S. PATENT DOCUMENTS

| | | | |
|---|---|---|---|
| 6,492,922 B1 | 12/2002 | New | |
| 6,768,780 B1* | 7/2004 | Lakkis | H04L 7/027 375/355 |
| 7,103,489 B2 | 9/2006 | Muhammad et al. | |
| 7,995,973 B2* | 8/2011 | Dent | H04B 1/525 375/260 |
| 8,204,162 B2* | 6/2012 | Seki | H04L 27/152 375/344 |
| 8,477,886 B2* | 7/2013 | Lindoff | H04B 1/123 375/344 |
| 8,594,228 B2* | 11/2013 | Sorrells | H03C 3/40 375/256 |
| 8,917,792 B2* | 12/2014 | Black | H04B 15/00 375/259 |
| 8,938,029 B2* | 1/2015 | Astrachan | H04B 1/30 375/319 |
| 9,215,120 B2* | 12/2015 | Rexberg | H04L 27/2624 |
| 9,325,339 B2* | 4/2016 | Cowley | H03M 1/0626 |
| 9,425,838 B1* | 8/2016 | Gupta | H04B 1/10 |
| 2003/0083852 A1 | 5/2003 | Muhammad et al. | |
| 2003/0189673 A1* | 10/2003 | Limberg | H03J 7/02 348/725 |
| 2004/0218693 A1* | 11/2004 | Hickling | H04B 1/0014 375/316 |
| 2006/0262831 A1* | 11/2006 | Kline | H04B 1/715 375/136 |
| 2007/0129041 A1* | 6/2007 | Yokoyama | H04B 1/28 455/280 |
| 2008/0238717 A1 | 10/2008 | Short et al. | |
| 2009/0286487 A1* | 11/2009 | Rofougaran | H03B 21/01 455/73 |
| 2011/0163900 A1* | 7/2011 | Pagnanelli | H03M 3/468 341/143 |
| 2011/0285585 A1* | 11/2011 | Bergamo | G01S 5/0072 342/357.31 |
| 2012/0269300 A1* | 10/2012 | Krishnan | H04B 1/001 375/340 |
| 2012/0322398 A1* | 12/2012 | Pullela | H03D 7/1466 455/302 |
| 2012/0328121 A1* | 12/2012 | Truman | G10L 21/038 381/94.3 |
| 2013/0095776 A1* | 4/2013 | Kavousian | H04B 1/109 455/114.3 |
| 2014/0010332 A1* | 1/2014 | Okamoto | H04B 1/28 375/340 |
| 2014/0059632 A1* | 2/2014 | McMullin | H04N 21/25883 725/111 |
| 2014/0064418 A1* | 3/2014 | Astrachan | H04B 1/30 375/344 |
| 2014/0141741 A1* | 5/2014 | Mikhemar | H04B 1/109 455/306 |
| 2014/0153627 A1* | 6/2014 | Gurney | H04B 1/1036 375/227 |
| 2014/0161159 A1* | 6/2014 | Black | H04B 15/00 375/219 |
| 2014/0307565 A1* | 10/2014 | Samarasooriya | H04B 1/18 370/252 |
| 2015/0071392 A1* | 3/2015 | Cheah | H04B 1/123 375/350 |
| 2015/0126146 A1* | 5/2015 | Wang | H04B 1/1027 455/296 |
| 2015/0333732 A1* | 11/2015 | Shaohua | H03H 17/0251 708/207 |
| 2015/0333950 A1* | 11/2015 | Johansson | H03M 1/0626 375/349 |
| 2016/0277173 A1* | 9/2016 | Dutronc | H04L 5/04 |

FOREIGN PATENT DOCUMENTS

| | | |
|---|---|---|
| CN | 101931425 A | 12/2010 |
| CN | 103208998 A | 7/2013 |
| JP | 2012247303 A | 12/2012 |

OTHER PUBLICATIONS

PCT Written Opinion, dated Feb. 27, 2015, in connection with International Application No. PCT/EP2014/073459, all pages.
Chinese Search Report, dated Aug. 22, 2018, in connection with Chinese Application No. 2014800831056, 3 pages.

* cited by examiner

RADIO RECEIVER, METHOD OF DETECTING AN OBTRUDING SIGNAL IN THE RADIO RECEIVER, AND COMPUTER PROGRAM

TECHNICAL FIELD

The present invention generally relates to a radio receiver, a method of detecting an obtruding signal in the radio receiver, and a computer program for implementing the method. In particular, the present invention relates to an approach for determining an obtruding signal causing aliasing effects in a sampled baseband signal.

BACKGROUND

Radio transmissions are analog in nature, considering the radio frequency signal being transmitted from a transmitter antenna to a receiver antenna. Radio receivers using a digital baseband circuit thus need to convert from analog to digital domain at some point. Analog-to-digital conversion may provide some issues, and one of them is aliasing effects. This is handled by applying an anti-aliasing filter prior to an analog-to-digital converter. However, filtering normally does not eliminate the issue completely, and some issues may still remain. It is therefore a desire to handle such remaining effects.

SUMMARY

The invention is based on the understanding that to be able to handle the effects of aliasing, it is good to get an indication of the amount or presence of the aliasing effects. The inventors have found that by performing some frequency translation operations on an oversampled baseband signal, it is feasible to estimate or detect the amount or presence of such effects.

According to a first aspect, there is provided a receiver comprising a mixer arranged to mix a received signal to an analog baseband signal at or close to zero-frequency, a filter arranged to low-pass filter said analog baseband signal, an analog-to-digital converter arranged to oversample, with an oversampling rate, said filtered analog baseband signal at a sample frequency such that a digital baseband signal is formed. The radio receiver comprises a mechanism for determining an obtruding signal causing aliasing effects of the combination of the filtered analog baseband signal and the sampling. The mechanism comprises a frequency translator arrangement arranged to translate the digital baseband signal around a Nyquist frequency being based on a nominal sample frequency, the nominal sample frequency being a fraction of the oversampling frequency according to the oversampling rate, to form a translated digital baseband signal such that signal content of the digital baseband signal around zero frequency will be translated to around the nominal sample frequency and vice versa in the translated digital baseband signal. The mechanism also comprises a detector arranged to determine a first signal level at zero frequency of the digital baseband signal and a second signal level at zero frequency of the translated digital baseband signal. Furthermore, the mechanism comprises an obtruding signal detector arranged to detect the obtruding signal based on a relation between the first and second signal levels and to output an obtruding signal state signal based on the detection of the obtruding signal.

Here, an "obtruding signal" is to be considered as a signal causing effects at sampling, e.g. a phony signal and/or interfering signal appearing at baseband by the aliasing. For the interested reader, the word obtrude is normally known to mean become noticeable in an unwelcome or intrusive way (Oxford Dictionary of Difficult Words, Oxford University Press, 2004).

The obtruding signal detector may be arranged to output one of at least a first obtruding signal state and a second obtruding signal state, based on the relation between the first and second signal levels, as the obtruding signal state signal. The first obtruding signal state may be output when the first signal level is higher than the second signal level. Alternatively, the first obtruding signal state may be output when the first signal level is significantly higher than the second signal level, wherein significantly higher is determined by a threshold. The second obtruding signal state may be output when the first signal level is lower than the second signal level. Alternatively, the second obtruding signal state may be output when the first signal level does not reach a significantly higher level than the second signal level, wherein significantly higher is determined by a threshold. The first obtruding signal state may be output when a quota of the first signal level and the second signal level is higher than a threshold, and where the second obtruding signal state is output when the quota is lower than the threshold.

The radio receiver may comprise a controller arranged to control at least one receiving parameter of the radio receiver based on the obtruding signal state signal.

According to a second aspect, there is provided a method of detecting an obtruding signal in a radio receiver having a mixer arranged to mix a received signal to an analog baseband signal at or close to zero-frequency, a filter arranged to low-pass filter said analog baseband signal, and an analog-to-digital converter arranged to sample said filtered analog baseband signal at a sample frequency such that a digital baseband signal is formed. The method comprises receiving a radio frequency signal, mixing the radio frequency signal to the analog baseband signal at or close to zero-frequency, low-pass filtering said analog baseband signal, and analog-to-digital converting said filtered analog baseband signal by oversampling, with an oversampling rate in relation to a nominal sample frequency, such that a digital baseband signal is formed. The method further comprises frequency translating the digital baseband signal around a Nyquist frequency being based on the nominal sample frequency to form a translated digital baseband signal such that signal content of the digital baseband signal around zero frequency will be translated to around the nominal sample frequency and vice versa in the translated digital baseband signal. The method still further comprises determining a first signal level at zero frequency of the digital baseband signal and a second signal level at zero frequency of the translated digital baseband signal, detecting an obtruding signal based on a relation between the first and second signal levels, and outputting an obtruding signal state signal based on the detection of the obtruding signal.

The outputting the obtruding signal state signal may comprise outputting one of at least a first obtruding signal state and a second obtruding signal state, based on the relation between the first and second signal levels. The first obtruding signal state may be output when the first signal level is higher than the second signal level. Alternatively, the first obtruding signal state is output when the first signal level is significantly higher than the second signal level, wherein significantly higher is determined by a threshold. The second obtruding signal state may be output when the first signal level is lower than the second signal level. The second obtruding signal state may be output when the first signal level does not reach a significantly higher level than the second signal level, wherein significantly higher is determined by a threshold. The first obtruding signal state may be output when a quota of the first signal level and the second signal level is higher than a threshold, and where the second obtruding signal state is output when the quota is lower than the threshold.

The method may comprise controlling at least one receiving parameter of the radio receiver based on the obtruding signal state signal. The controlling of at least one receiving parameter of the radio receiver may comprise adjusting filter parameters for the low-pass filtering for limiting the obtruding signal. The controlling of at least one receiving parameter of the radio receiver may comprise, when the first signal level is significantly lower than the second signal level, wherein significantly lower is determined by a threshold, omitting further signal processing of the received signal on that tuned input signal.

The frequency translating the digital baseband signal around the Nyquist frequency may comprise multiplying the digital baseband signal with $e^j$, or a limited terms Taylor expansion thereof, where n is a sample sequence number for respective sample.

The determining of the respective signal levels may be performed by calculating $$\frac{1}{N}\sum_{n=1}^{N} S(n),$$

where N a number of samples observed, n is a sample sequence number, and S(n) is a sample of the respective signal.

The signal may be a quadrature signal comprising an in-phase component I and a quadrature component Q, wherein the determining of the respective signal levels may be performed by calculating $$\frac{1}{N}\sum_{n=1}^{N} I(n) \text{ and } \frac{1}{N}\sum_{n=1}^{N} Q(n),$$

where N is a number of samples observed, n is a sample sequence number, and I(n) and Q(n) are samples of the respective signal components, and calculating the respective signal levels from squares of the respective signal components.

The signal may be a quadrature signal comprising an in-phase component I and a quadrature component Q, wherein the determining of the respective signal levels may be performed by filtering the oversampled I and Q signal components with a low-pass filter, and determining the first signal level as $$\frac{1}{N}\sum_{n=1}^{N} \{I_{LPF}^2(n) + Q_{LPF}^2(n)\},$$

filtering the frequency translated signal with the low-pass filter, and determining the second signal level as $$\frac{1}{N}\sum_{n=1}^{N} \{I_{TRANS,LPF}^2(n) + Q_{TRANS,LPF}^2(n)\};$$

where N is a number of samples observed, n is a sample sequence number, $I_{LPF}(n)$ and $Q_{LPF}(n)$ are the filtered oversampled I and Q signal components, respectively and $I_{TRANS,LPF}(n)$ and $Q_{TRANS,LPF}(n)$ are the filtered frequency translated signal components.

According to a third aspect, there is provided a computer program comprising instructions which, when executed on a processor of a communication apparatus, causes the communication apparatus to perform the method according to the second aspect.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
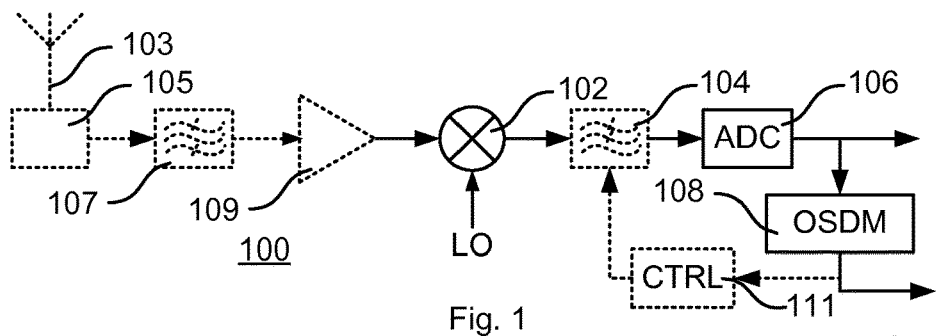
FIG. 1 schematically illustrates a receiver according to an embodiment.

FIG. 1 schematically illustrates a receiver 100 according to an embodiment. The receiver 100 comprises a mixer 102 arranged to mix a received signal to an analog baseband signal at or close to zero-frequency. The received signal may be received through an antenna 103 which provides the signal to the receiver 100 and through for example a duplexer 105, a band-pass filter 107, and a low-noise amplifier 109, which is coupled to the input of the mixer 102. The mixer 102 is also provided with an oscillator signal, LO, to enable the mixing. The output of the mixer 102 may be provided to a low-pass filter 104, which limits the bandwidth of the analog baseband signal before being provided to an analog-to-digital converter 106.

The analog-to-digital converter 106 converts the analog baseband signal to a digital baseband signal. The analog-to-digital converter may be arranged for using oversampling, i.e. the sampling rate is multiple times the Nyquist frequency required for the nominal bandwidth of the analog baseband signal. The selection of whether to use oversampled data or non-oversampled data from the analog-to-digital converter 106 may be based on what kind of signal and/or for what purpose the signal is received. For example, for scanning for finding a suitable frequency, e.g. during cell search in a cellular communication system, non-oversampled data may be used in order to reduce the complexity of cell-search algorithm and to reduce the power consumption. The receiver 100 further comprises a mechanism for determining an obtruding signal, or Obtruding Signal Determination Mechanism, OSDM, 108, which will be further demonstrated below. The receiver 100 may also comprise a controller 111 which based on an output of the OSDM 108 controls receiving parameters of the receiver 100, e.g. the low-pass filter 104.

Figure 2:
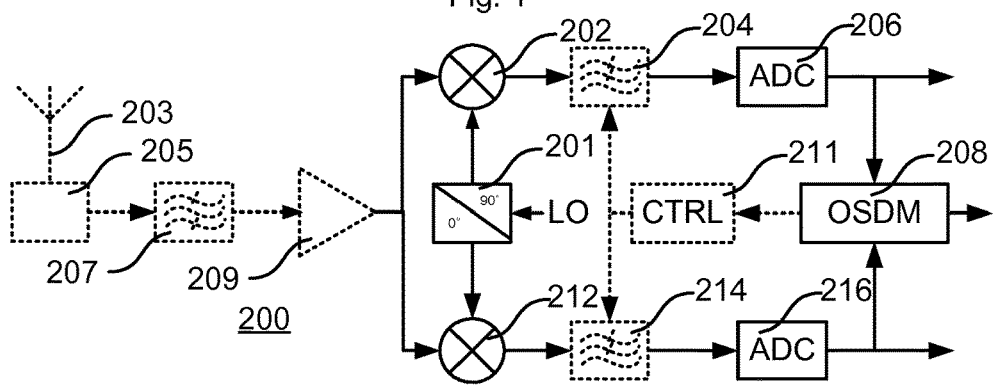
FIG. 2 schematically illustrates a receiver according to an embodiment.

FIG. 2 schematically illustrates a receiver 200 according to an embodiment. The receiver 200 comprises one signal path arranged to provide an in-phase baseband signal and one signal path that is arranged to provide a quadrature-phase baseband signal. The receiver 200 comprises a first mixer 202 arranged to mix a received signal to an in-phase analog baseband signal and a second mixer 212 arranged to mix the received signal to a quadrature-phase analog baseband signal, both at or close to zero-frequency. The received signal may be received through an antenna 203 which provides the signal to the receiver 200 and through for example a duplexer 205, a band-pass filter 207, and a low-noise amplifier 209, which is coupled to the inputs of the mixers 202, 212. The mixers 202, 212 are also provided with an oscillator signal, LO, via a phase splitter 201 to enable the mixing, where the phase splitter provides versions of the oscillator signal being mutually in quadrature, i.e. the mutual phase difference is π/2 or 90°. The outputs of the mixers 202, 212 are provided to low-pass filters 204, 214, respectively, which limit the bandwidth of the analog baseband signals before being provided to respective analog-to-digital converters 206, 216. The analog-to-digital converters 206, 216 convert the analog baseband signals to respective digital baseband signals using oversampling, i.e. the sampling rate is multiple times the Nyquist frequency required for the nominal bandwidth of the analog baseband signals. The receiver 200 further comprises a mechanism for determining an obtruding signal, or Obtruding Signal Determination Mechanism, OSDM, 208, which will be further demonstrated below. The receiver 200 may also comprise a controller 211 which based on an output of the OSDM 208 controls receiving parameters of the receiver 200, e.g. the low-pass filters 204, 214. FIGS. 3-10 illustrate different scenarios as baseband spectrum diagrams, i.e. signal s to frequency f, where an obtrusive signal introduces aliasing.

Figure 3:
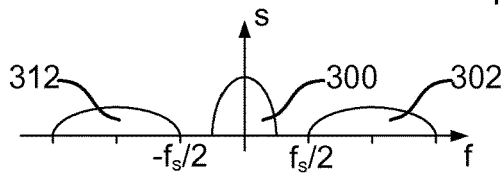
FIGS. 3-10 illustrate different scenarios where an obtrusive signal introduces aliasing effect.
Figure 4:
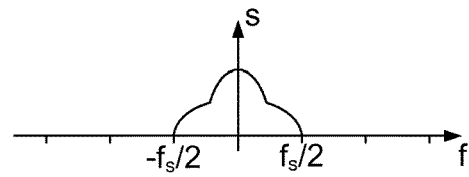

FIGS. 3 and 4 illustrate a first scenario where an analog baseband signal is shown in FIG. 3 having a desired signal 300 centred around zero frequency and an adjacent, in frequency, signal 302, 312. In the diagram, the frequency is indicated in view of sampling frequency to be applied. Thus, in the example of FIG. 3, the Nyquist frequency, i.e. half the sampling frequency, is twice the bandwidth of the desired signal 300, i.e. a two times oversampling is to be applied. FIG. 4 illustrates the non-oversampled baseband signal, which here is observed only below the Nyquist frequency. Here, it can be seen that aliasing effects "fold" the adjacent signal 302, 312 into the desired signal, which of course becomes interfering, i.e. the adjacent signal becomes obtrusive.

Figure 5:
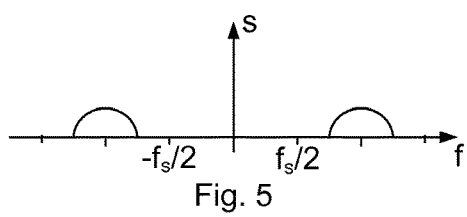
Figure 6:
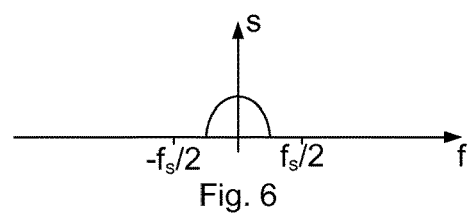

FIGS. 5 and 6 illustrate a second scenario. Similar to the illustrations in FIGS. 3 and 4, FIG. 5 illustrates the analog baseband signal and FIG. 6 illustrates the sampled baseband signal. In this scenario, no signal is present at the desired frequency, but the aliasing causes a "ghost" signal to appear after sampling, although no signal was actually present on the desired frequency. This may for example cause phony detections of signals, i.e. the adjacent signal becomes obtrusive.

To avoid or at least alleviate these phenomena, the low-pass filters 104, 204, 214 demonstrated above should limit the frequency components outside the nominal bandwidth of the desired signal. On the other hand, the filters do not have infinite attenuation outside the band, and very steep filters may also have undesired effects, also other than filter complexity.

Figure 7:
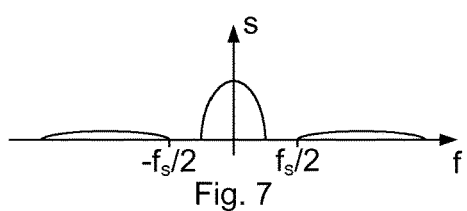
Figure 8:
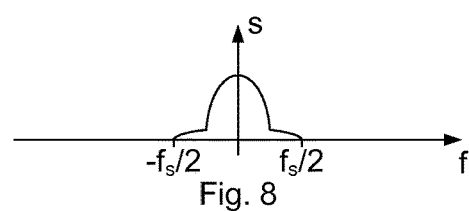
Figure 9:
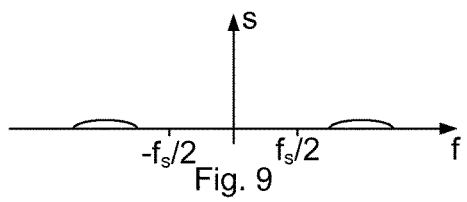
Figure 10:
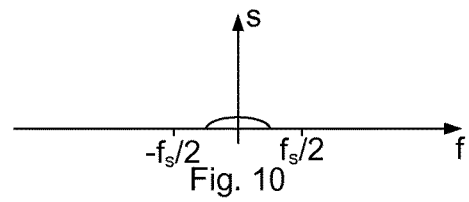

FIG. 7 illustrates the analog baseband signal from the first scenario where the analog baseband signal has been low-pass filtered, and FIG. 8 illustrates the corresponding sampled signal. Similarly, FIG. 9 illustrates the analog baseband signal from the second scenario where the analog baseband signal has been low-pass filtered, and FIG. 10 illustrates the corresponding sampled signal. However, whether the filtering helped enough for proper reception or not may still depend on demands on the signal, features and performance of further signal processing, e.g. demodulation/decoding/etc., and the signal strength of the obtrusive signal.

With reference to FIGS. 11 to 18, the approach will be thoroughly demonstrated as an example. FIGS. 11 to 18 are illustrated as baseband spectrum diagrams, i.e. signal s to frequency f. The obtruding signal is emphasized by patterned filling in FIGS. 11 to 18 for easier distinguishing the desired and obtruding signals. It is further to be noticed that the sampling frequency $f_s$ denoted in the diagrams considers the nominal sampling frequency, although some of the diagrams illustrate oversampled signals.

Figure 11:
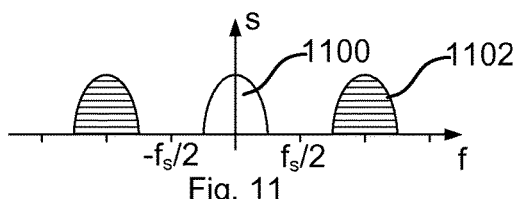
FIG. 11 illustrates a received analog signal.

FIG. 11 illustrates a received analog signal downconverted to analog baseband around zero frequency. A desired signal 1100 and an adjacent signal 1102 are shown. Also here, the frequency is indicated with reference to sampling frequency, and for easier understanding with reference to the above discussed spectrum diagrams of FIGS. 3 to 10, an oversampling rate of two is also used here, although other oversampling rates are equally feasible.

Figure 12:
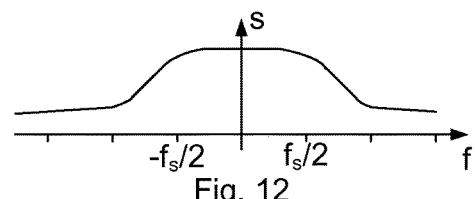
FIG. 12 illustrates an example of filter characteristics for band limiting filtering of a signal prior to analog-to-digital conversion.

FIG. 12 illustrates an example of filter characteristics for band limiting filtering of a signal prior to analog-to-digital conversion, i.e. the low-pass filtering made by any of the filters 104, 204, 214 demonstrated with reference to FIGS. 1 and 2. The filter characteristic may be other than the depicted, but this example show some typical issues with real-world filters used in relevant contexts. For example, the filter characteristic may be chosen such that frequency characteristics are constant across the nominal bandwidth of the desired signal. This provides for low distortion of the desired signal, but in practice also implies that the filter normally will not have high attenuation directly outside the nominal bandwidth. Furthermore, as shown in the example, the filter characteristics have finite, perhaps even moderate, steepness, and also finite, maybe here also moderate, attenuation even at frequencies far from the nominal bandwidth.

Figure 13:
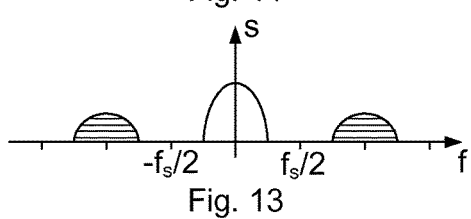
FIG. 13 illustrates a filtered signal to be analog-to-digital converted.

FIG. 13 illustrates a filtered signal to be analog-to-digital converted, i.e. the signal illustrated in FIG. 11 filtered by the filter characteristics illustrated in FIG. 12. The adjacent signal is thus attenuated, but still present.

Figure 14:
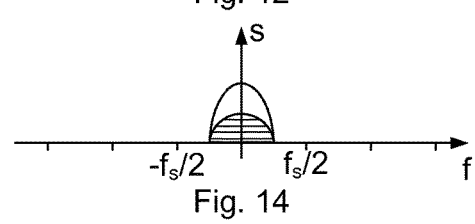
FIG. 14 illustrates a non-oversampled digital signal with aliasing effects.

FIG. 14 illustrates a non-oversampled digital signal with aliasing effects. Here, it can be seen that the adjacent signal, although attenuated by the filter having characteristics as illustrated in FIG. 12, is folded around the Nyquist frequency directly into around zero frequency, and thus becomes an obtrusive signal causing the aliasing effects.

The Obtruding Signal Determination Mechanism, OSDM, operates on an oversampled signal, which enables the determination of aliasing effects in the signal as of FIG. 14 above. This will be demonstrated for two examples below with reference to FIGS. 15 and 16, and FIGS. 17 and 18, respectively.

Figure 15:
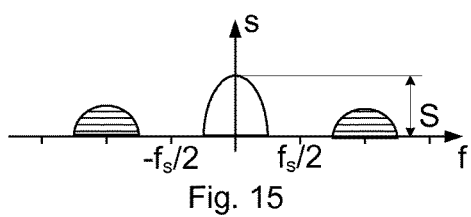
FIG. 15 illustrates an oversampled digital signal.
Figure 16:
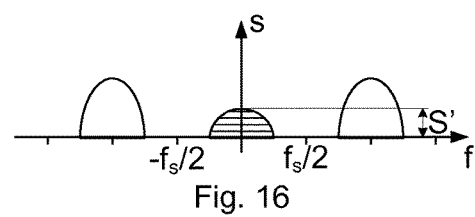
FIG. 16 illustrates a frequency translated oversampled digital signal.

FIG. 15 illustrates an oversampled digital signal with the obtruding signal. That is, the signal strength S, as illustrated in FIG. 15, at zero frequency is measured, which represents the desired signal. The frequency components of the spectrum are translated, which will be further elucidated below, such that signal content of the digital baseband signal around zero frequency will be translated to around the Nyquist frequency and vice versa in the translated digital baseband signal, which is illustrated in FIG. 16. The signal strength S', as illustrated in FIG. 16, at zero frequency of the frequency translated digital baseband signal is measured. Thus, the measurement of the signal S will be a representation of the desired signal and the measurement of the signal S' will be a representation of an obtrusive signal. However, depending on the spectral signature of the respective signals, i.e. as of FIG. 13, the representations may in some case not be free from contribution by the other signal, i.e. the desired signal or the adjacent signal, respectively. Therefore, the value of S' may not in itself give a clear picture of the presence/impact of the obtruding signal. By using both signal levels S and S', it is possible to detect the obtruding signal based on a relation between the first and second signal levels S, S'.

The frequency translation is made around a Nyquist frequency being based on a downsample frequency. The downsample frequency is here a fraction of the sample frequency according to the oversampling rate. The translated digital baseband signal is thus formed as demonstrated above.

Figure 17:
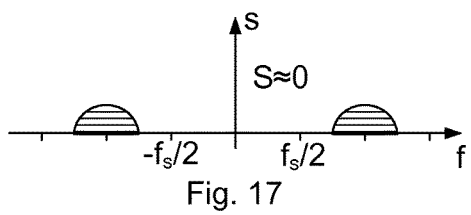
FIG. 17 illustrates an oversampled digital signal.
Figure 18:
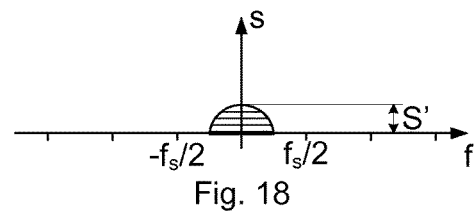
FIG. 18 illustrates a frequency translated oversampled digital signal.

FIG. 17 illustrates an oversampled digital signal with the obtruding signal. Here, it can be seen that the desired signal is not present, but, as demonstrated with reference to FIGS. 9 and 10 a phony or ghost signal may be detected at aliasing. A first signal level S is measured at zero frequency of the digital baseband signal, which here is about zero. FIG. 18 illustrates a frequency translated oversampled digital signal for this example, where signal strength S' at zero frequency of the frequency translated digital baseband signal is measured. Similar to the previous example, it is possible to detect the obtruding signal based on a relation between the first and second signal levels S, S'. Here, the case is considered that the desired signal in FIG. 17 is not present, i.e. S would essentially be zero, while S', as of FIG. 18 would be about the same as demonstrated above since the contributions are more or less only made by the adjacent signal being folded into the desired spectrum. Thus, any detection of a signal in the digital baseband signal would be able to be rejected as being a phony or ghost signal.

Since the impact of an obtrusive signal now can be detected, there is a possibility for the receiver to adapt features to at least limit the impact. Examples on such adaptations may for example be to adapt the filters 104, 204, 214, adapt oversampling rate, adapt signal processing of the digital baseband signal by following circuitry, adapting signal schemes, etc. to make the reception as a whole less prone to aliasing effects. According to some embodiments, an advantage may be to avoid using more complex processing than needed while the processing is efficient enough for proper reception. According to some embodiments, an advantage is to avoid using processing that may distort signals when not needed while the processing is efficient enough for proper reception. According to some embodiments, an advantage is to avoid using frequencies that may make proper reception hard.

Figure 19:
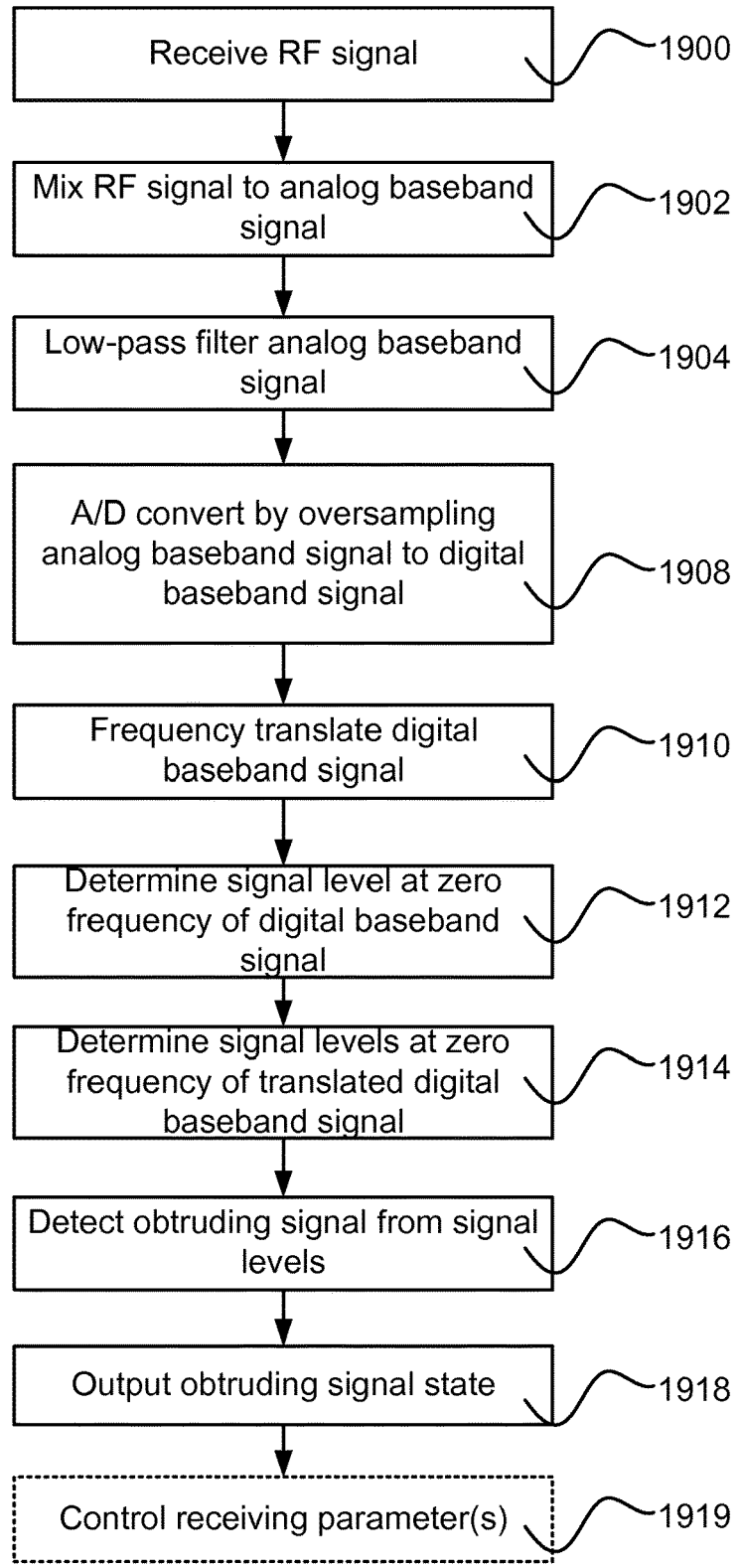
FIG. 19 is a flow chart illustrating a method according to an embodiment.

FIG. 19 is a flow chart illustrating a method according to an embodiment. A signal is received 1900 and mixed 1902 into an analog baseband signal around at or close to zero frequency. The analog baseband signal is low-pass filtered 1904. The filtered signal is analog-to-digital converted 1908 into digital domain by oversampling with an oversampling rate, e.g. two times, such that a digital baseband signal is formed. This digital baseband signal is provided for further signal processing, such as demodulation, decoding, etc. For determining impact of any obtruding signal, the digital baseband signal is frequency translated 1910, as demonstrated above, to form a frequency translated digital baseband signal. This frequency translated digital baseband signal is only used for the determination of impact of any obtruding signal. A signal level S at zero frequency is determined 1912 for the digital baseband signal. Similarly, a signal level S' at zero frequency is determined 1914 for the frequency translated digital baseband signal. These signal levels are used for detecting 1916 any obtruding signal, and an obtruding signal state signal may be output 1918. Optionally, the obtruding signal state signal may be used for controlling 1919 receiving parameters, as demonstrated above.

Roughly speaking, if the signal level S' is low and the signal level S is high, i.e. we have a strong signal in the digital baseband signal and the indication on the aliasing effects through the signal S' is moderate, we expect an obtruding signal state signal indicating low or negligible impact by any aliasing effects. On the other hand if the signal level S' is high and the signal level S is low, i.e. we have a weak or signal in the digital baseband signal and the indication on the aliasing effects through the signal S' is considerable, we expect an obtruding signal state signal indicating high impact by aliasing effects. Optionally, there may be assigned further granularity in the obtruding signal state signals, for example when we have a strong signal in the digital baseband signal and the indication on the aliasing effects through the signal S' is considerable, there may be one or more obtruding signal states assigned for those scenarios too, or these scenarios may be lumped together with one or the other of the two states demonstrated above, depending on the issue aimed to combat. In the case of both strong/considerable signal levels S, S', there may be benefits from making adaptations in the receiver parameters for improving reception, as will be further demonstrated below, e.g. for limiting interference.

From this discussion, we see that observing the relation between the signal levels S, S' provides the information needed for being able to handle the aliasing effects. Some examples on observing the relation between the signal levels are demonstrated below.

Figure 20:
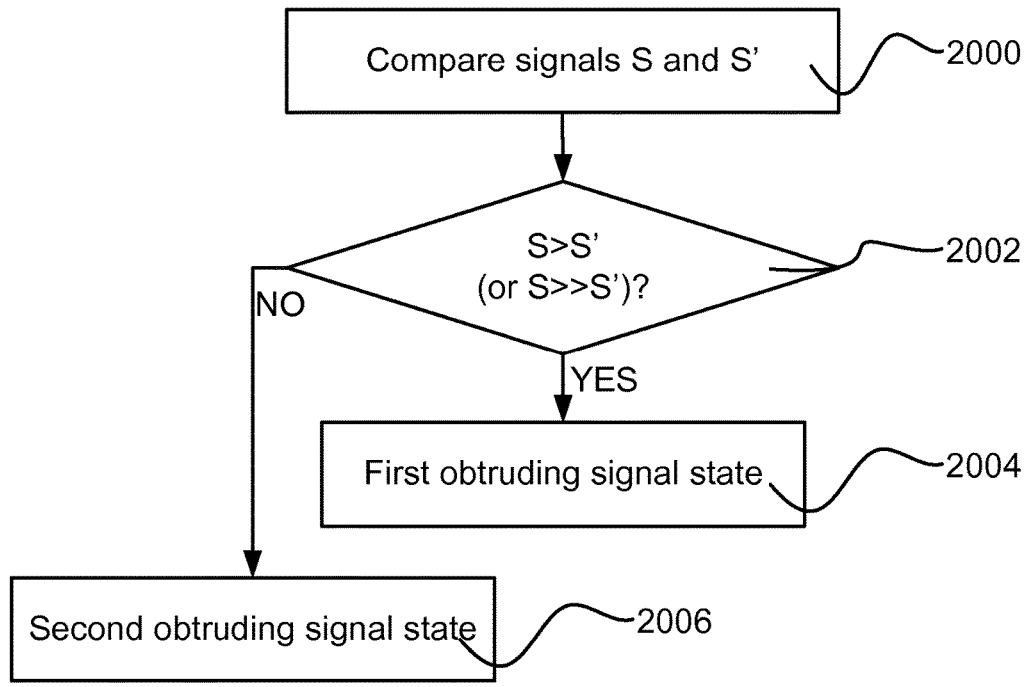
FIG. 20 is a flow chart illustrating actions related to detection of an obtruding signal according to an embodiment.

FIG. 20 is a flow chart illustrating actions related to detection of an obtruding signal according to an embodiment. As demonstrated above, a first signal level S is determined at zero frequency of the digital baseband signal, and a second signal level S' is determined at zero frequency of the frequency translated digital baseband signal. The first and second signal levels S, S' are compared 2000. It is checked 2002 whether the second signal level S' is larger than the first signal level S (or if the first signal level S is larger than the second signal level S'). Depending on the outcome, a first obtruding signal state is output 2004, or a second obtruding signal state is output 2006. Optionally, the check 2002 may comprise to check if the difference between the signal levels S, S', e.g. S–S', is significant, e.g. S–S'>t, where t is a threshold, whereupon states may be output 2004, 2006 accordingly. Thus, more than two different obtruding signal states may be present. One or more thresholds may be assigned for determining if the difference is "significant", and to what degree. The level of the one or more thresholds may be set for example based on simulations on issues that the determination of aliasing effects aims to combat for the particular receiver or reception situation.

Figure 21:
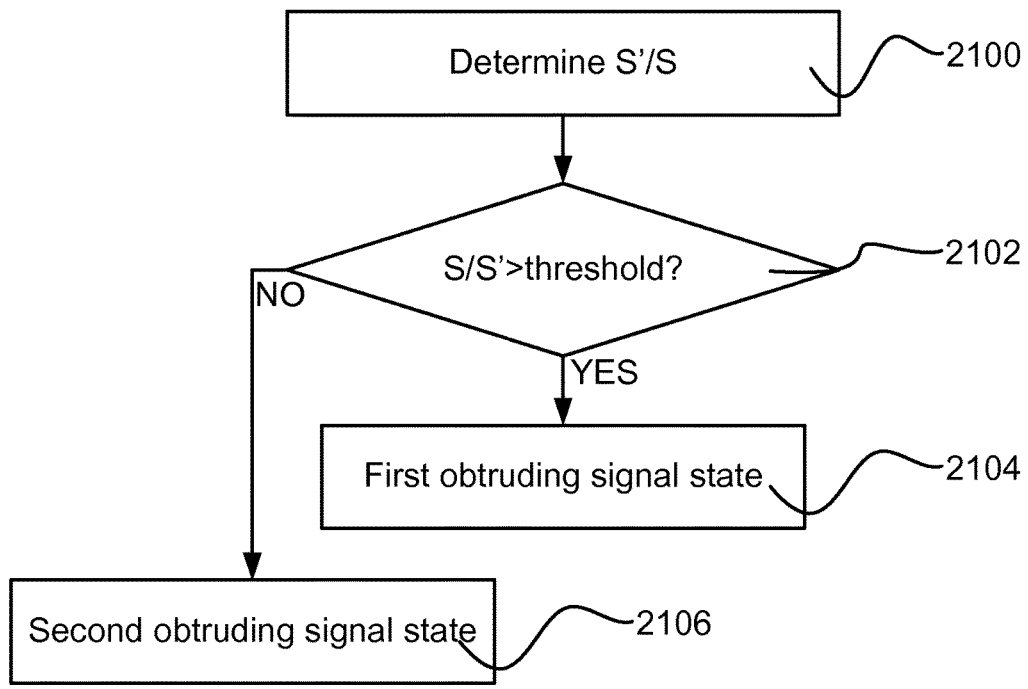
FIG. 21 is a flow chart illustrating actions related to detection of an obtruding signal according to an embodiment.

FIG. 21 is a flow chart illustrating actions related to detection of an obtruding signal according to an embodiment. As demonstrated above, a first signal level S is determined at zero frequency of the digital baseband signal, and a second signal level S' is determined at zero frequency of the frequency translated digital baseband signal. The first and second signal levels S, S' are compared by determining 2100 a quota between the first level and the second level S/S' (or between the second signal level S' and the first signal level S). It is checked 2102 whether the quota is larger (or smaller) than a threshold. Depending on the outcome, a first obtruding signal state is output 2104, or a second obtruding signal state is output 2106. Optionally, the check 2102 may comprise to check the quota against more than one threshold, i.e. if the difference between the signal levels S,S' is significant, whereupon states may be output 2104, 2106 accordingly. Thus, more than two different obtruding signal states may be present, and one or more thresholds may be assigned for determining the obtruding signal state. The level of the one or more thresholds may be set for example based on simulations on issues that the determination of aliasing effects aims to combat for the particular receiver or reception situation.

Figure 22:
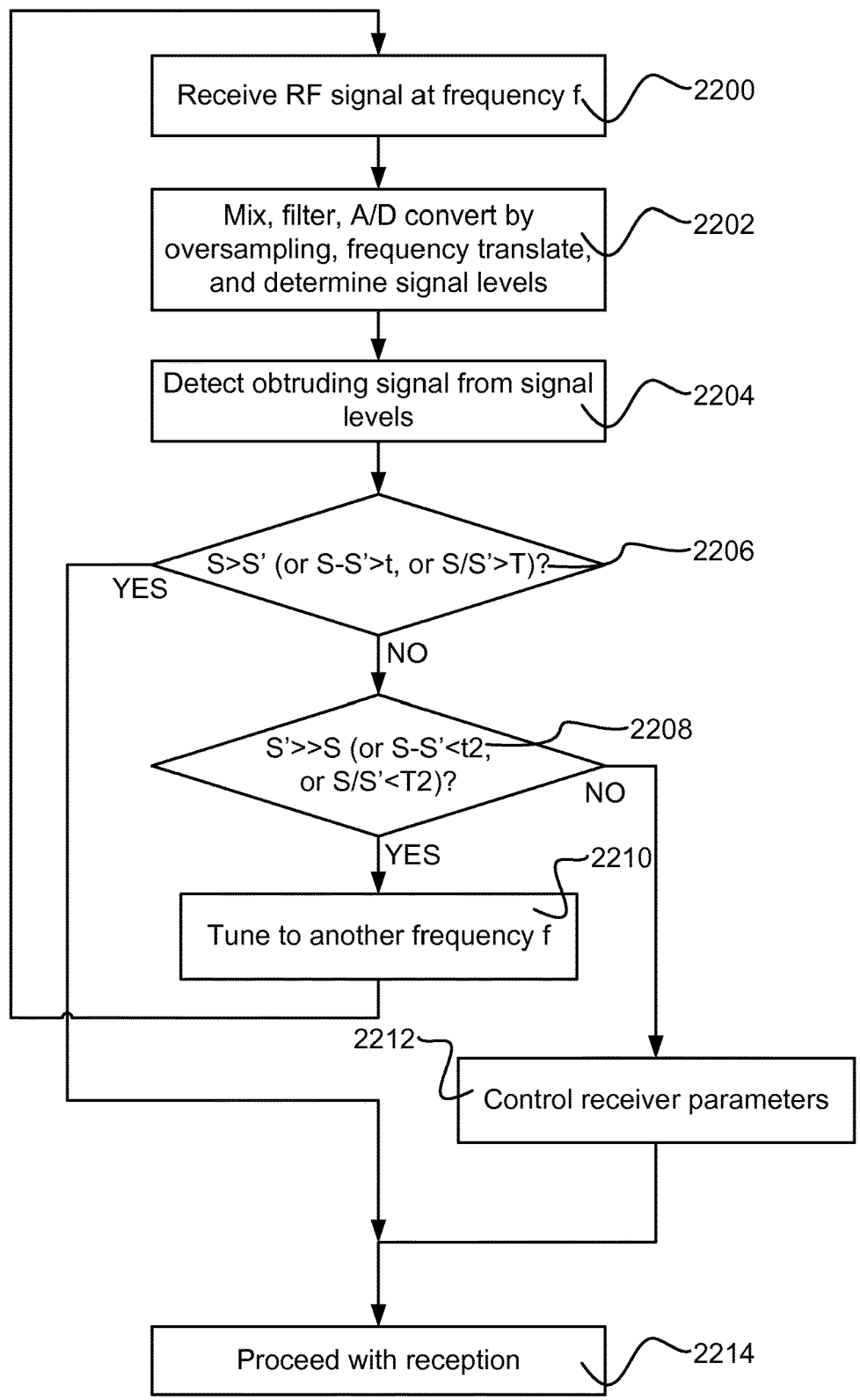
FIG. 22 is a flow chart illustrating an example of adapting reception using the principles according to an embodiment.

FIG. 22 is a flow chart illustrating an example of adapting reception using the principles according to an embodiment. A signal is received 2200 and the received signal is processed 2202 as demonstrated above, i.e. mixed into an analog baseband signal around at or close to zero frequency, the analog baseband signal is low-pass filtered, analog-to-digital converter by oversampling with an oversampling rate such that a digital baseband signal is formed, the digital baseband signal is frequency translated to form a frequency translated digital baseband signal, the signal level S at zero frequency is determined for the digital baseband signal, and the signal level S' at zero frequency is determined for the frequency translated digital baseband signal. Thus, the two signal levels S, S' are obtained as demonstrated above wherein the obtruding signal is detected 2204 accordingly. It is checked 2206 whether the relation between the signals is such that the impact of any obtruding signal is negligible or not, i.e. in the context of the current reception. This may be performed by comparing the signal levels directly with each other, comparing a difference between the signal levels with a threshold t, or comparing a quota between the signal levels with a threshold T. If the impact is negligible, the reception proceeds 2214 with the reception. If not, a further check 2208 is made whether the impact is significant. Similar comparisons as demonstrated above may be performed here, but with slightly different criterion or thresholds t2, T2. Here, for example if the reception is for cell search and the impact is significant, the procedure may include omitting further processing of the received signal, tuning 2210 to another frequency and starting all over again with receiving 2200 a signal. Significant may here be determined by comparing with a threshold, i.e. either comparing a difference between the signals or comparing a quota between the signals with a threshold, wherein the threshold is set such that it can be determined whether proper reception does not seem feasible. If it is determined 2208 that reception still seems feasible, but the impact of the obtrusive signal may demand improvements of reception, the procedure may proceed with controlling receiver parameters, e.g. change filter parameters etc. as demonstrated above, and thereafter the procedure proceeds 2214 with the reception.

For example, during cell re-selection and received signal strength indicator, RSSI, measurement in a communication apparatus for cellular communication, the receiver may find the alias frequency as one of the potential cells and goes ahead with cell search operations. The cell search operation continues with its processing as the signal amplitude of that "found" cell frequency, i.e. appearing as aliasing frequency, may be sufficiently high. Once the stronger RSSI algorithm selects that cell, hereafter called Ghost cell, then it tries to do cell search operations, which also may pass as the signal level was good of that aliasing frequency. That may mean that a primary scrambling code of the cell is identified and then a broadcast channel, BCH, information is also read by the receiver, i.e. if the obtruding signal is an adjacent broadcast channel. These operations may take time, energy and processing power. At this stage, the communication device may experience that it has camped to the desired proper cell. But, when it tries to send an uplink message, it will not match with the network's expectation of the uplink frequency since frequency allocation will be wrong, and no response will be present from the network. Further, the communication device may increase interference by its erroneous transmission. In addition to the unnecessarily spent time, energy and processing power, this may also lead to a radio link failure. However, by being able to detect that it is a Ghost cell, i.e. detect that it is only an obtruding signal, these drawbacks may be avoided.

The measurement of the signals S, S' may be derived from samples of the digital baseband signal and frequency translated baseband signals, respectively. For the case of a receiver as demonstrated with reference to FIG. 1 the derivations are performed by calculating signal levels is performed by calculating $$S = \frac{1}{N}\sum_{n=1}^{N} S(n), \text{ and}$$

$$S' = \frac{1}{N}\sum_{n=1}^{N} S'(n),$$

N is a number of samples observed, n is a sample sequence number, and S(n) and S'(n) are samples of the respective signal.

Similarly, for the case of a quadrature receiver of FIG. 2, it is performed by calculating, respectively, I, I', Q and Q' as $$I = \frac{1}{N}\sum_{n=1}^{N} I(n),$$

$$I' = \frac{1}{N}\sum_{n=1}^{N} I'(n),$$

$$Q = \frac{1}{N}\sum_{n=1}^{N} Q(n), \text{ and}$$

$$Q' = \frac{1}{N}\sum_{n=1}^{N} Q'(n),$$

where

N is a number of samples observed, n is a sample sequence number, and I(n), I'(n), Q(n) and Q'(n) are samples of the respective signal components for the respective signals. From this, the signal levels S, S' are determined by calculating the respective signal levels from squares of the respective signal components, i.e.

$$S = \sqrt{I^2 + Q^2}, \text{ and}$$

$$S' = \sqrt{I'^2 + Q'^2}.$$

Another method to identify the obtruding signal, which could also be used as an alternative to the above described dc measurement based method, is provided below:

Let us consider a simple low pass filter (LPF) function with cut-off frequency ($f_s/2$) Hz, where $f_s$ is the nominal sampling frequency. An oversampled signal, e.g. twice oversampled, is filtered with this LPF, wherein it is feasible to find out the power of signal of it as $$\frac{1}{N}\sum_{n=1}^{N} \{I_{LPF}^2(n) + Q_{LPF}^2(n)\};$$

where N is a number of observed samples, n is a sample sequence number and $I_{LPF}(n)$ and $Q_{LPF}(n)$ are the filtered oversampled signal components. A frequency translated signal is formed, as demonstrated above with relation to nominal sampling frequency $f_s$, and the frequency translated signal is filtered with the LPF wherein it is feasible to compute the signal level as the signal power of it as $$\frac{1}{N}\sum_{n=1}^{N} \{I_{TRANS,LPF}^2(n) + Q_{TRANS,LPF}^2(n)\};$$

where N is a number of samples observed, n is a sample sequence number and $I_{TRANS,LPF}(n)$ and $Q_{TRANS,LPF}(n)$ are the filtered frequency translated signal components. The detection of the obtruding signal may then be made from the relation between these signal power levels similar to what has been demonstrated with the other embodiments, and output or actions may also be in line with what has been demonstrated with the other embodiments.

Figure 23:
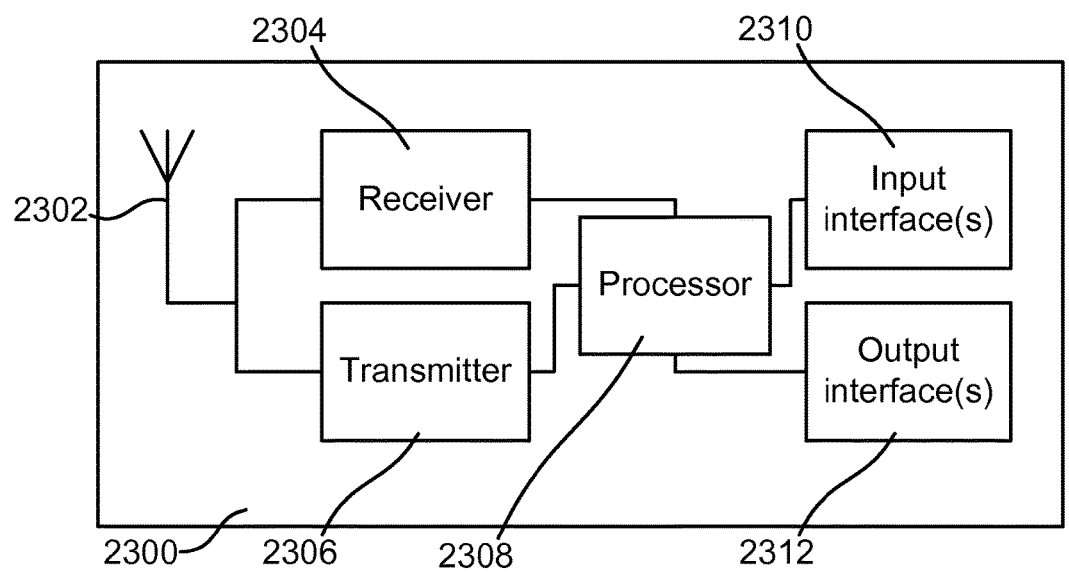
FIG. 23 is a block diagram schematically illustrating a communication device according to an embodiment.

FIG. 23 is a block diagram schematically illustrating a communication device 2300 according to an embodiment. The communication device 2300 comprises an antenna arrangement 2302, a receiver 2304 connected to the antenna arrangement 2302, a transmitter 2306 connected to the antenna arrangement 2302, a processing element 2308 which may comprise one or more circuits, one or more input interfaces 2310 and one or more output interfaces 2312. The interfaces 2310, 2312 can be user interfaces and/or signal interfaces, e.g. electrical or optical. The communication device 2300 is arranged to operate in a cellular communication network. In particular, by the receiver 2304 being arranged to perform the embodiments demonstrated with reference to FIGS. 1 to 18, the communication device 2300 is capable of detecting an obtruding signal state, and optionally perform control of reception accordingly. The processing element 2308 can also fulfill a multitude of tasks, ranging from signal processing to enable reception and transmission since it is connected to the receiver 2304 and transmitter 2306, executing applications, controlling the interfaces 2310, 2312, etc.

Figure 24:
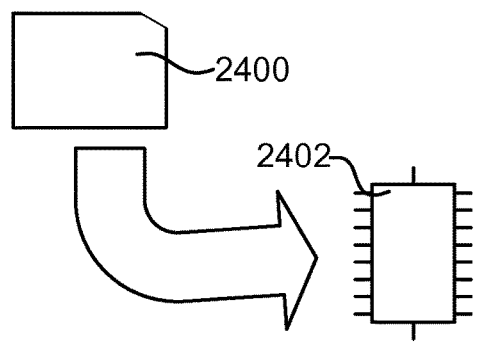
FIG. 24 schematically illustrates a computer-readable medium and a processing device.

The methods according to the present invention is suitable for implementation with aid of processing means, such as computers and/or processors, especially for the case where the receiver 2304 demonstrated above comprises a processor handling controlling receiver parameters etc. as demonstrated above. Therefore, there is provided computer programs, comprising instructions arranged to cause the processing means, processor, or computer to perform the steps of any of the methods according to any of the embodiments described with reference to FIGS. 19 to 22. The computer programs preferably comprises program code which is stored on a computer readable medium 2400, as illustrated in FIG. 24, which can be loaded and executed by a processing means, processor, or computer 2402 to cause it to perform the methods, respectively, according to embodiments of the present invention, preferably as any of the embodiments described with reference to FIGS. 19 to 22. The computer 2402 and computer program product 2400 can be arranged to execute the program code sequentially where actions of the any of the methods are performed stepwise. The computer 2402 and computer program product 2400 can be arranged to execute the program code on a real-time basis performing steps when input data is available and thus sometimes perform some steps in parallel. The processing means, processor, or computer 2402 is preferably what normally is referred to as an embedded system. Thus, the depicted computer readable medium 2400 and computer 2402 in FIG. 24 should be construed to be for illustrative purposes only to provide understanding of the principle, and not to be construed as any direct illustration of the elements.

The invention claimed is:

1. A radio receiver comprising:
 a mixer arranged to mix a received signal to an oscillator signal to output an analog baseband signal at or close to zero-frequency;
 a filter arranged to low pass filter said analog baseband signal;
 an analog-to-digital converter arranged to oversample, with an oversampling rate, said filtered analog baseband signal at a sample frequency such that a digital baseband signal is formed,
 wherein the radio receiver comprises a mechanism for determining an obtruding signal causing aliasing effects of the combination of the filtered analog baseband signal and the oversampling, the mechanism comprising:
 a frequency translator arrangement arranged to translate the digital baseband signal around a Nyquist frequency being based on a nominal sample frequency, the nominal sample frequency being a fraction of an oversampling frequency according to the oversampling rate, to form a translated digital baseband signal such that signal content of the digital baseband signal around zero frequency will be translated to around the nominal sample frequency and signal content of the digital baseband signal around the nominal sample frequency will be translated to around zero frequency;

a detector arranged to determine a first signal level at zero frequency of the digital baseband signal and a second signal level at zero frequency of the translated digital baseband signal; and an obtruding signal detector arranged to detect the obtruding signal based on a relation between the first and second signal levels and to output an obtruding signal state signal based on the detection of the obtruding signal.

2. The radio receiver of claim 1, wherein the obtruding signal detector is arranged to output one of at least a first obtruding signal state and a second obtruding signal state, based on the relation between the first and second signal levels, as the obtruding signal state signal.

3. The radio receiver of claim 2, where the first obtruding signal state is output when the first signal level is higher than the second signal level.

4. The radio receiver of claim 2, where the first obtruding signal state is output when the first signal level reaches a significantly higher level than the second signal level, wherein the significantly higher level is determined by a threshold.

5. The radio receiver of claim 2, where the second obtruding signal state is output when the first signal level is lower than the second signal level.

6. The radio receiver of claim 2, where the second obtruding signal state is output when the first signal level does not reach a significantly higher level than the second signal level, wherein the significantly higher level is determined by a threshold.

7. The radio receiver of claim 2, where the first obtruding signal state is output when a quota of the first signal level and the second signal level is higher than a threshold, and where the second obtruding signal state is output when the quota is lower than the threshold.

8. The radio receiver of claim 1, comprising a controller arranged to control at least one receiving parameter of the radio receiver based on the obtruding signal state signal.

9. The radio receiver of claim 8, comprising a filter arranged to low-pass filter said analog baseband signal, and the controller arranged to adjust filter parameters for the low-pass filtering for limiting the obtruding signal.

10. A method of detecting an obtruding signal in a radio receiver having a mixer arranged to mix a received signal to an oscillator signal to output an analog baseband signal at or close to zero-frequency, a filter arranged to low-pass filter said analog baseband signal and an analog-to-digital converter arranged to sample said filtered analog baseband signal at a sample frequency such that a digital baseband signal is formed, the method comprising:

receiving a radio frequency signal;

mixing the radio frequency signal to the oscillator signal to output the analog baseband signal at or close to zero-frequency;

low-pass filtering said analog baseband signal;

analog-to-digital converting said analog baseband signal by oversampling, with an oversampling rate in relation to a nominal sample frequency, such that a digital baseband signal is formed;

frequency translating the digital baseband signal around a Nyquist frequency being based on the nominal sample frequency to form a translated digital baseband signal such that signal content of the digital baseband signal around zero frequency will be translated to around the nominal sample frequency and signal content of the digital baseband signal around the nominal sample frequency will be translated to around zero frequency;

determining a first signal level at zero frequency of the digital baseband signal and a second signal level at zero frequency of the translated digital baseband signal;

detecting an obtruding signal based on a relation between the first and second signal levels; and outputting an obtruding signal state signal based on the detection of the obtruding signal.

11. The method of claim 10, wherein the outputting the obtruding signal state signal comprises outputting one of at least a first obtruding signal state and a second obtruding signal state, based on the relation between the first and second signal levels.

12. The method of claim 11, where the first obtruding signal state is output when the first signal level is higher than the second signal level.

13. The method of claim 11, where the first obtruding signal state is output when the first signal level reaches a significantly higher level than the second signal level, wherein the significantly higher level is determined by a threshold.

14. The method of claim 11, where the second obtruding signal state is output when the first signal level is lower than the second signal level.

15. The method of claim 11, where the second obtruding signal state is output when the first signal level does not reach a significantly higher level than the second signal level, wherein the significantly higher level is determined by a threshold.

16. The method of claim 11, where the first obtruding signal state is output when a quota of the first signal level and the second signal level is higher than a threshold, and where the second obtruding signal state is output when the quota is lower than the threshold.

17. The method of claim 10, comprising controlling at least one receiving parameter of the radio receiver based on the obtruding signal state signal.

18. The method of claim 17, wherein the radio receiver comprises a filter arranged to low-pass filter said analog baseband signal, and the controlling of at least one receiving parameter of the radio receiver comprises adjusting filter parameters for the low-pass filtering for limiting the obtruding signal.

19. The method of claim 17, wherein the controlling of at least one receiving parameter of the radio receiver comprises, when the first signal level is significantly lower than the second signal level, wherein significantly lower is determined by a threshold, omitting further signal processing of the received signal on that tuned input signal.

20. The method of claim 10, wherein the frequency translating the digital baseband signal around the Nyquist frequency comprises multiplying the digital baseband signal with $e^{-j\pi n}$, or a limited terms Taylor expansion thereof, where n is a sample sequence number for respective sample.

21. The method of claim 10, wherein the determining of the respective signal levels is performed by calculating $$\frac{1}{N}\sum_{n=1}^{N}S(n),$$

where N is a number of samples observed, n is a sample sequence number, and S(n) is a sample of the respective signal.

22. The method of claim 10, wherein the signal is a quadrature signal comprising an in-phase component I and a quadrature component Q, wherein the determining of the respective signal levels is performed by
calculating $$\frac{1}{N}\sum_{n=1}^{N} I(n) \text{ and } \frac{1}{N}\sum_{n=1}^{N} Q(n),$$

where N is a number of samples observed, n is a sample sequence number, and I(n) and Q(n) are samples of the respective signal components; and
calculating the respective signal levels from squares of the respective signal components.

23. The method of claim 10, wherein the signal is a quadrature signal comprising an in-phase component I and a quadrature component Q, wherein the determining of the respective signal levels is performed by
filtering the oversampled I and Q signal components with a low-pass filter; and determining the first signal level as $$\frac{1}{N}\sum_{n=1}^{N} \{I_{LPF}^2(n) + Q_{LPF}^2(n)\};$$

filtering the frequency translated signal with the low-pass filter; and
determining the second signal level as $$\frac{1}{N}\sum_{n=1}^{N} \{I_{TRANS,LPF}^2(n) + Q_{TRANS,LPF}^2(n)\},$$

where N is a number of samples observed, n is a sample sequence number, $I_{LPF}(n)$ and $Q_{LPF}(n)$ are the filtered oversampled signal I and Q components, respectively, and $I_{TRANS,LPF}(n)$ and $Q_{TRANS,LPF}(n)$ are the filtered frequency translated signal components.

24. A nontransitory computer readable storage medium comprising a computer program comprising instructions which, when executed on a signal processor of a radio receiver, causes the radio receiver to perform a method of detecting an obtruding signal in the radio receiver, wherein the radio receiver has a mixer arranged to mix a received signal to an oscillator signal to output an analog baseband signal at or close to zero-frequency, a filter arranged to low-pass filter said analog baseband signal and an analog-to-digital converter arranged to sample said filtered analog baseband signal at a sample frequency such that a digital baseband signal is formed, and wherein the method comprises:
receiving a radio frequency signal;
mixing the radio frequency signal to the oscillator signal to output the analog baseband signal at or close to zero-frequency;
low-pass filtering said analog baseband signal;
analog-to-digital converting said analog baseband signal by oversampling, with an oversampling rate in relation to a nominal sample frequency, such that a digital baseband signal is formed;
frequency translating the digital baseband signal around a Nyquist frequency being based on the nominal sample frequency to form a translated digital baseband signal such that signal content of the digital baseband signal around zero frequency will be translated to around the nominal sample frequency and signal content of the digital baseband signal around the nominal sample frequency will be translated to around zero frequency;
determining a first signal level at zero frequency of the digital baseband signal and a second signal level at zero frequency of the translated digital baseband signal;
detecting an obtruding signal based on a relation between the first and second signal levels; and
outputting an obtruding signal state signal based on the detection of the obtruding signal.

\* \* \* \* \*